United States Patent
Wachinger

(10) Patent No.: US 10,163,591 B2
(45) Date of Patent: Dec. 25, 2018

(54) MOTOR VEHICLE OPERATING DEVICE WITH SOUND-GENERATING SWITCHING ELEMENT

(71) Applicant: AUDI AG, Ingolstadt (DE)

(72) Inventor: Michael Wachinger, Winkelhausen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/553,518

(22) PCT Filed: Jan. 28, 2016

(86) PCT No.: PCT/EP2016/000147
§ 371 (c)(1),
(2) Date: Aug. 24, 2017

(87) PCT Pub. No.: WO2016/142024
PCT Pub. Date: Sep. 15, 2016

(65) Prior Publication Data
US 2018/0033573 A1     Feb. 1, 2018

(30) Foreign Application Priority Data
Mar. 7, 2015 (DE) .................. 10 2015 003 002

(51) Int. Cl.
*H05K 1/02* (2006.01)
*H01H 23/00* (2006.01)
(Continued)

(52) U.S. Cl.
CPC ........... *H01H 23/006* (2013.01); *H05K 7/142* (2013.01); *B60K 2350/1036* (2013.01); *H01H 2003/0293* (2013.01); *H01H 2215/03* (2013.01)

(58) Field of Classification Search
CPC .. H01H 13/83; H01H 2219/062; H01H 3/125; H01H 2219/036; H01H 13/023;
(Continued)

(56) References Cited

U.S. PATENT DOCUMENTS 4,885,443 A * 12/1989 Simcoe ................ H01H 13/023
200/296
9,006,590 B2 * 4/2015 Bailey .................... H01H 13/06
200/302.2
(Continued)

FOREIGN PATENT DOCUMENTS

AT           135994 B      12/1933
CN           1787145        6/2006
(Continued)

OTHER PUBLICATIONS

German Office Action dated Oct. 7, 2015 from German Patent Application No. 10 2015 003 002.7, 5 pages.
(Continued)

*Primary Examiner* — Ahmed Saeed
(74) *Attorney, Agent, or Firm* — Staas & Halsey LLP

(57) ABSTRACT

An operating device includes a casing, an operating button arranged at the casing for the manual actuation of the operating device, and a printed circuit board that is arranged in the casing. A switching element is mechanically coupled to the operating button and arranged on the printed circuit board. The switching element produces a pronounced sound when the operating button is actuated. To this end, next to the switching element, the printed circuit board is mechanically connected to the casing by at least one support element and each support element is designed to stabilize the printed circuit board against a tremor that is produced by the switching element when producing the sound.

20 Claims, 2 Drawing Sheets

(51) Int. Cl.
*H05K 7/14* (2006.01)
*H01H 3/02* (2006.01)

(58) Field of Classification Search
CPC ........ H01H 13/70; H01H 13/705; H05K 1/02; H05K 1/18; H05K 3/30; H05K 3/32; G06F 3/016; G06F 3/0416; G06F 3/0488; G06F 3/0414; G06F 2203/014
USPC ......... 362/367, 368, 372–374; 200/5 A, 344, 200/310–317
See application file for complete search history.

(56) References Cited

U.S. PATENT DOCUMENTS

| | | | |
|---|---|---|---|
| 9,441,817 B2 * | 9/2016 | Chiu | F21V 19/0055 |
| 2006/0132347 A1 | 6/2006 | Hanahara et al. | |
| 2016/0076754 A1 * | 3/2016 | Creusen | F21V 29/505 362/84 |

FOREIGN PATENT DOCUMENTS

| | | |
|---|---|---|
| CN | 103250221 | 8/2013 |
| DE | 1 202 862 B | 10/1965 |
| DE | 32 40 267 A1 | 5/1984 |
| DE | 44 25 154 C1 | 10/1995 |
| DE | 203 04 661 U1 | 6/2003 |
| DE | 203 05 528 U1 | 8/2003 |
| DE | 102 37 719 B4 | 12/2011 |
| DE | 10 2010 061 455 A1 | 6/2012 |
| DE | 10 2012 019 718 A1 | 4/2014 |
| DE | 10 2015 003 002.7 | 3/2015 |
| EP | 0 450 319 A2 | 10/1991 |
| EP | 1 321 954 A1 | 6/2003 |
| WO | 2014/056600 | 4/2014 |
| WO | PCT/EP2016/000147 | 1/2016 |

OTHER PUBLICATIONS

International Search Report dated Jul. 13, 2016 from International Patent Application No. PCT/EP2016/000147, 5 pages.
Chinese Office Action dated Apr. 17, 2018 from Chinese Patent Application No. 201680014050.2, 6 pages.
Translation of the International Preliminary Report on Patentability dated Sep. 8, 2017 from International Patent Application No. PCT/EP2016/000147, 7 pages.

* cited by examiner

MOTOR VEHICLE OPERATING DEVICE WITH SOUND-GENERATING SWITCHING ELEMENT

CROSS REFERENCE TO RELATED APPLICATIONS

This application is a U.S. national stage of International Application No. PCT/EP2016/000147, filed on Jan. 28, 2016. The International Application claims the priority benefit of German Application No. 10 2015 003 002.7 filed on Mar. 7, 2015. Both the International Application and German Application are incorporated by reference herein in their entirety.

BACKGROUND

Described herein is an operating device for a motor vehicle. By way of example, an infotainment system of the motor vehicle can be operated by using the operating device. The operating device may include at least one operating button for the manual actuation of the operating device, the operating button being arranged at a casing. Each operating button may be mechanically coupled to a switching element in each case, the latter being switched by the actuation of the operating button and producing a sound, for example clicking, as a result thereof.

In the context of the disclosure, an operating device should be understood to refer to an appliance which may include at least one mechanical operating button and a switching element that is mechanically coupled thereto. The switching element may be embodied to produce an electrical signal depending on an actuation of the operating button. By way of example, the switching element can be an electrical pushbutton or an electrical switch.

If an operating device is actuated by a user of a motor vehicle, i.e. if at least one operating button is actuated, feedback which signals to the user that the operating device was successfully actuated is desirable. Acoustic feedback is one option, i.e. an operating noise, for example a clicking, is produced in the passenger compartment upon actuation of an operating button. It is particularly expedient in this case if no additional circuit elements, e.g. a loudspeaker, are required for producing the operating noise. To this end, provision can be made for the switching element that is switched by the actuation of the operating button to itself produce airborne sound, for example a clicking sound.

A problem that may arise during the mechanical production of the operating noise by the switching element is that of the acoustic sounding too dull for the switching pulse. That is to say, the pronounced click noise of, e.g., a microswitch sounds very dull.

German Patent Application No. 203 04 661 U1 describes the arrangement of the switching element on a printed circuit board so that the clicking is particularly loud.

SUMMARY

The operating device for a motor vehicle as described herein is based on developing feedback or a confirmation signal for a user operating an operating device in a motor vehicle.

The operating device described herein may include a casing and at least one operating button for the manual actuation of the operating device, the operating button being arranged at the casing. A circuit board is arranged in the casing. At least one switching element is arranged on the printed circuit board. Each switching element is respectively mechanically coupled to an operating button. Expressed differently, the operating button acts directly or indirectly via at least one further mechanical element on the switching element should the operating button be actuated. Thus, the respective switching element is switched or pressed or actuated by the mechanical coupling when the associated operating button is actuated. As a result, each switching element also respectively produces a sound when the operating button is actuated. The switching element radiates this sound into its surroundings. In other words, a clicking or cracking of the switching element is output into the casing as airborne sound. The airborne sound in the casing can then be guided into the passenger compartment, for example by an acoustic channel, where it can be perceived by the user as an operating noise.

An advantage arising from the operating device described herein is that this sound is used to produce the operating noise in the passenger compartment. In other words, no additional sound producing element, e.g. a loudspeaker, is required to produce the desired operating noise. To this end, the described printed circuit board is mechanically coupled to the casing by, in each case, at least one support element, for example by at least two support elements, next to each switching element. By way of example, the support element can be a rod. The support element is designed to stabilize the printed circuit board against a vibration or a tremor that is produced by the switching element when producing the sound. Expressed differently, there are fewer vibrations with the support element than without the support element when the switching element is switched and the sound is produced in the process. The casing wall is advantageously used for stiffening the printed circuit board.

The operating device also includes developments with features, by which further advantages emerge.

In accordance with a development, a distance from each support element to the respectively closest switching element is less than 2 centimeters, in particular less than 1.5 centimeters. As a result of this, an affixation or a stiffening of the printed circuit board is particularly pronounced. In other words, the operating noise becomes particularly loud.

In accordance with a development, the at least one operating button and the switching element that is respectively mechanically coupled therewith are mechanically coupled by way of a rocker. A particularly small part of the sound is dissipated via a rocker on account of its flexibility, and so a particularly large part of the sound is emitted as airborne sound and not introduced into the material of the operating appliance as body-borne sound.

In accordance with a development, a material of each support element has a hardness of greater than 3 Mohs. Expressed differently, the material of each support element is particularly hard or rigid or brittle. In particular, the material of the support element is acoustically hard, i.e. damping of the sound is particularly low. Additionally, or as an alternative thereto, each support element is formed from metal, in particular iron or steel. These two developments are particularly advantageous in that the production of the sound is particularly low loss.

In accordance with a development, a tensile force or a compressive force is in each case applied to the printed circuit board by the support element in the case of at least one support element, in particular in the case of each support element. Expressed differently, the printed circuit board is mechanically pretensioned by the support element. An advantage arising as a result thereof is that the printed circuit board itself is more rigid as result of the mechanical pretension than without the pretension.

In accordance with a development, at least one support element, or each support element, is formed by a rod or screw in each case. An advantage arising therefrom is that the support element is particularly rigid along the direction of longitudinal extent of the cylindrical base form of the rod or of the screw.

In accordance with a development, each switching element is embodied to produce the sound as a pulse or clicking. The pulse is, in particular, shorter than 500 milliseconds. An advantage arising herefrom is that the sound contains particularly many different frequencies, in particular frequencies above a minimum frequency which, for example, may lie in the range from 500 Hz to 1000 Hz. Expressed differently, the operating noise can be heard particularly clearly in the passenger compartment of the motor vehicle. Additionally, or as an alternative thereto, the sound can be produced by using a clicker. An advantage arising therefrom is that, for the purposes of producing the sound, use is made of a robust component with a simple mechanical configuration.

Many of the above-described advantages can be obtained or obtained particularly easily in accordance with an embodiment by virtue of each switching element being configured as a microswitch in each case. A microswitch is also referred to as a miniature snap-action switch.

A development provides for a plurality of switching elements to be arranged on the printed circuit board and for at least one support element to be arranged between respectively two of the switching elements. As a result of this, the support element can be used for both switching elements. As a result, particularly few support elements are required, for example particularly few screws.

Also described herein is a motor vehicle having an the operating device as described herein. By way of example, the operating device can be provided, or else designed, for operating an infotainment system or a climate control or a vehicle dynamics control. The motor vehicle described herein may be, for example, configured as a motor-powered vehicle, in particular as an automobile.

Also described herein is a method, by which an operating noise of the operating device described above is set, the operating noise being audible in a passenger compartment. To this end, a tone criterion for the operating noise is predetermined, the tone criterion e.g. being able to include the following conditions outlined below. It is possible to predetermine a predefined minimum overall volume of the operating noise and/or a minimum power or a minimum volume in a frequency range above a predetermined minimum frequency, for example 500 Hz, 800 Hz or 1000 Hz. It is also possible to predetermine a predefined timbre, i.e. an envelope for the spectrum of the operating noise.

Provision is made of at least one support element which is designed to mechanically connect the printed circuit board to the casing and stabilize the printed circuit board against a vibration or tremor that is produced by the switching element when producing the sound.

When the operating element is actuated repeatedly, a check is carried out as to whether the operating noise that has reached the passenger compartment satisfies the tone criterion. If the operating noise infringes the tone criterion, the operating noise is modified. This is brought about by adjusting a number of provided support elements and/or the position of at least one provided support element. This is carried out until the tone criterion is satisfied. If the tone criterion is satisfied, the number and the position of the required support elements is known. This is followed by producing at least one further operating device which has the same number of support elements at the same positions as the operating device which satisfies the tone criterion. Expressed differently, the operating device is thus reproduced.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
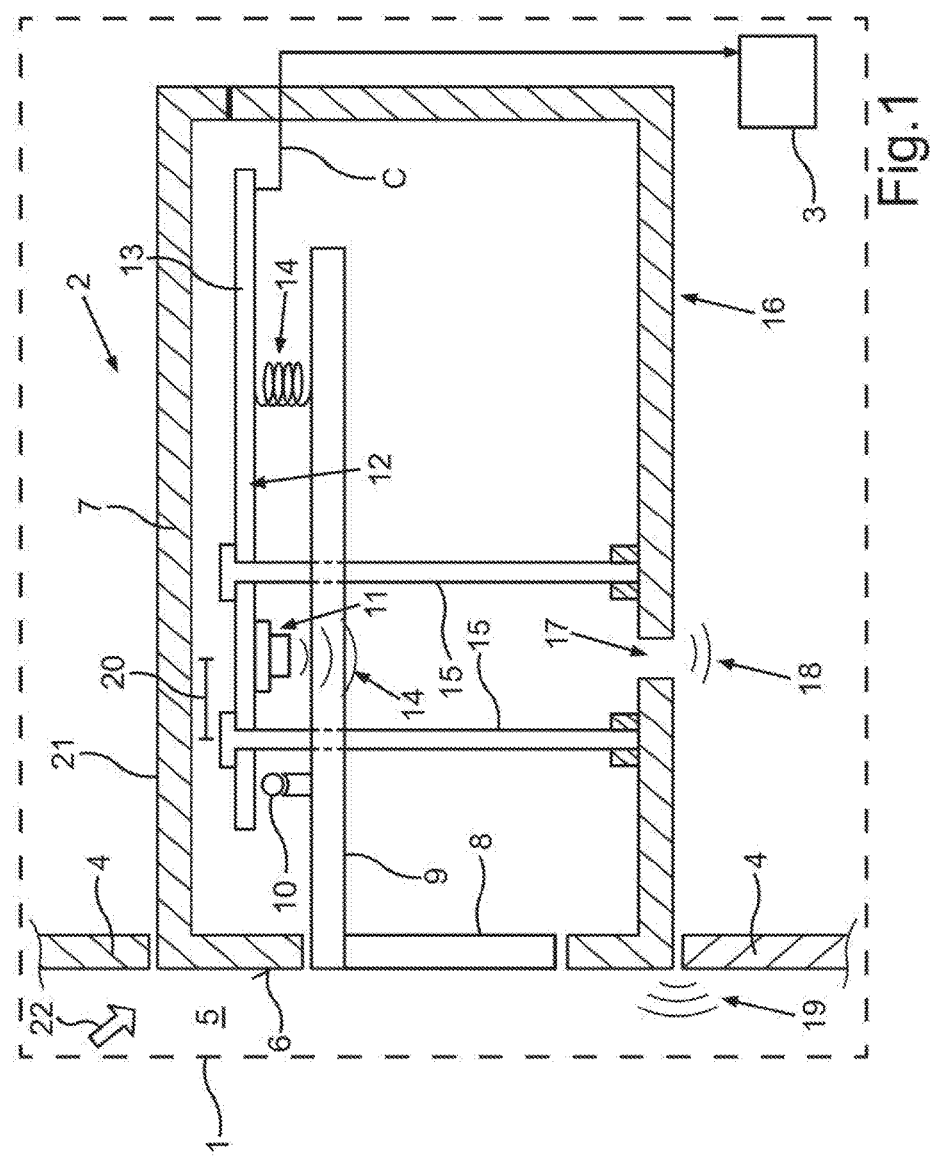
FIG. 1 is a schematic illustration of an embodiment of a motor vehicle described herein.

Reference will now be made in detail to embodiments, examples of which are illustrated in the accompanying drawings, wherein like reference numerals refer to like elements throughout.

Exemplary embodiments are described below with reference to the drawings. However, the described components of the embodiments in the exemplary embodiments each present individual features which can be considered independently of one another and each also develop the disclosure independently of one another and which therefore should also be considered both individually and in a different combination than the one shown. Moreover, the described embodiments can also be complemented by further features already described above.

In the drawings, elements that have the same function are provided with the same reference sign in each case.

FIG. 1 shows a motor vehicle 1, which may be e.g., a motor-driven vehicle, in particular an automobile. The motor vehicle 1 may include an operating device 2. Using the operating device, a user is able to operate a vehicle component 3, e.g., an infotainment system or a climate control or a suspension control of the motor vehicle 1. The operating device 2 can be arranged in internal paneling 4 of the motor vehicle, which e.g., may be part of the instrument panel or a center console of the motor vehicle 1.

An operating side 6 of a casing 7 of the operating device 2 can face a passenger compartment 5 of the motor vehicle 1. An operating button or an actuation element 8, which may be e.g., a button, can be provided on the operating side 6 of the casing 7. The actuation element 8 can be arranged on a rocker 9 which may be configured as e.g., an injection molded part. The rocker 9 may be mounted such that it is rotatable about an axis of rotation 10. In the shown example, the axis of rotation 10 is perpendicular to the plane of the drawing. By way of example, the axis of rotation 10 may be provided or formed by a rod or a bar which, for example, may be manufactured from metal.

The actuation element 8 can be mechanically coupled to a switching element 11 by way of the rocker 9. The switching element 11 can be an electric switch, in particular a microswitch. A circuit 12 can be switched or an electrical signal can be produced by using the switching element 11. The circuit 12 can be formed by a circuit board or a printed circuit board 13. A control signal C for the vehicle component 3 can be produced depending on the switching signal of the switching element 11 by way of a control circuit (not presented here), which may be formed by the circuit 12.

In the non-actuated state, i.e. if a user does not actuate the actuation element 8, the rocker 9 can be pressed into the rest position or initial position, presented in FIG. 1, by way of a return element 14. When the actuation element 8 is actuated, a restoring force is applied to the rocker 9 by the return element 4. The return element 14 may be provided by e.g. a spring or a molded bent part, for example made of metal.

During switching, the switching element 11 produces a sound 14 which is emitted from the switching element 11 into the casing 7. The sound 14 is particularly loud and has particularly high acoustic power in a frequency range above 500 hertz, in particular above 700 hertz. To this end, the switching element 11 is fastened particularly securely in the casing 2. By way of example, the switching element 11 may be soldered onto the printed circuit board 13. Moreover, a screw-in connection, respectively made with one screw 15, is provided next to the switching element 11 to the left and to the right in each case. In each case, this screw 15 constitutes a support element. This solid connection between printed circuit board 13 and the casing 7 substantially contributes to making a clicking noise, which is produced by the switching element 11 during switching, audible in the passenger compartment 5. The effect becomes clear in a particularly vivid manner if a screw 15 is removed. The operating noise 19 when actuating the affected actuation element 8 immediately sounds duller, i.e. the acoustic power above the aforementioned minimum frequency is reduced; in particular, it is only 70% of the acoustic power with all support elements. Hence, pronounced, high-frequency clicking is produced by the solid screwed connection, the clicking being audible in the passenger compartment 5. The sound 14 can be guided out of the casing 2 through an acoustic channel 17, e.g. a passage opening in a casing wall 16 of the casing 2. The airborne sound 18 guided out of the casing 7 reaches the passenger compartment 5 in part. The component 19 of the airborne sound 18 penetrating into the passenger compartment is then heard as operating noise 19 by the user.

For the purposes of efficient stiffening of the printed circuit board 7 by the casing wall 16, a distance 20 of a support element from the switching element 11 on the printed circuit board 13 is for example, less than 2 cm, in particular less than 1.5 cm.

Figure 2:
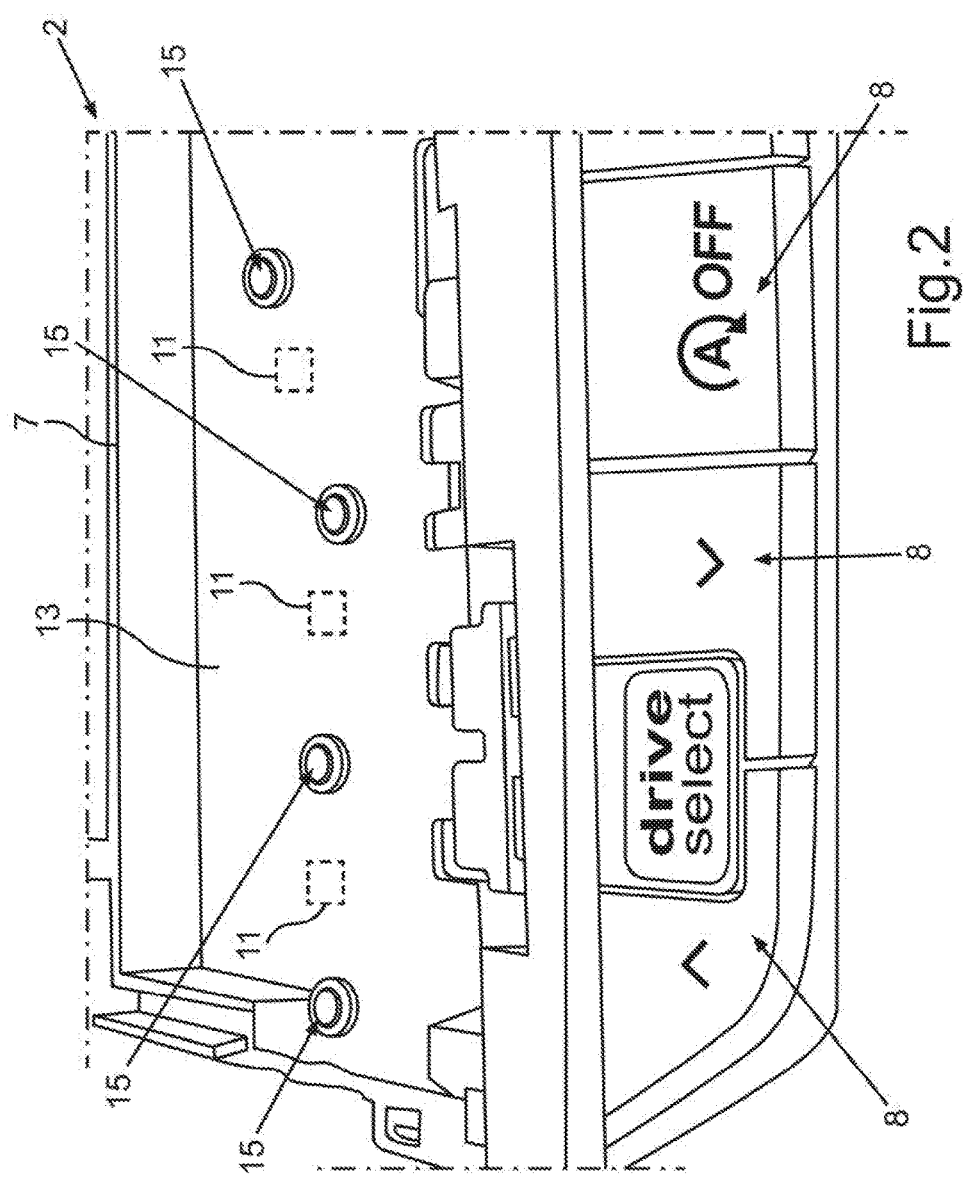
FIG. 2 is a schematic illustration of a perspective view of an operating device which may be provided in the motor vehicle of FIG. 1.

For the purposes of elucidating an example screw position, FIG. 2 presents a plan view of the operating device 2, in which a cover 21 was removed. The perspective presented in FIG. 2 was recorded from a direction of view which is identified in FIG. 1 by a directional arrow 22.

The operating device 2 may include a plurality of actuation elements 8 and hence a plurality of mechanically coupled switching elements 11. FIG. 2 elucidates that a support element, for example in the form of a screw 15, should be arranged between two switching elements 11 in each case.

Overall, the example shows how the operating device described herein allows the pitch to be increased in the case of a switching element by way of a solid connection of the circuit board or printed circuit board (e.g. by screwing).

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV,* 358 F3d 870, 69 USPQ2d 1865 (Fed. Cir. 2004).

The invention claimed is:

1. An operating device for a motor vehicle, comprising:
   a casing including a casing wall, the casing wall provided with an acoustic channel including a passage opening;
   an operating button, disposed at the casing, configured to manually actuate the operating device;
   a printed circuit board disposed in the casing;
   a switching element, disposed at the printed circuit board and mechanically coupled to the operating button, configured to produce a sound when the operating button is actuated, the sound produced by the switching element being transmitted out of the casing through the passage opening included in the acoustic channel provided in the casing wall; and
   at least two support elements disposed next to the switching element, configured to mechanically connect the printed circuit board to the casing, each of the at least two support elements being spaced apart from the switching element by a distance less than two centimeters and configured to stabilize the printed circuit board against a tremor produced by the switching element when the switching element produces the sound, and each of the at least two support elements correspond to a screw and is made of a metal material.

2. The operating device as claimed in claim 1, wherein the distance each of the at least two support elements is spaced apart from the switching element is less than 1.5 centimeters.

3. The operating device as claimed claim 1, wherein the switching element is mechanically coupled to the operating button by a rocker.

4. The operating device as claimed claim 1, wherein the metal material of the at least two support elements has a hardness of greater than three Mohs.

5. The operating device as claimed as claim 1, wherein the metal material of the at least two support elements includes iron or steel.

6. The operating device as claimed claim 1, wherein the at least two support elements are configured to apply a tensile force or a compressive force onto the printed circuit board.

7. The operating device as claimed in claim 1, wherein the switching element is configured to produce the sound as a pulse or clicking sound.

8. The operating device as claimed in claim 1, wherein the switching element is configured to produce the sound using a clicker.

9. The operating device as claimed in claim 1, wherein the switching element is configured as a microswitch.

10. The operating device as claimed in claim 1, wherein a plurality of switching elements are disposed at the printed circuit board and at least one support element is disposed between two adjacent switching elements.

11. A motor vehicle, comprising:
    a chassis; and
    an operating device, including:
       a casing including a casing wall, the casing wall provided with an acoustic channel including a passage opening;
       an operating button, disposed at the casing, configured to manually actuate the operating device;
       a printed circuit board disposed in the casing;
       a switching element, disposed at the printed circuit board and mechanically coupled to the operating button, configured to produce a sound when the operating button is actuated, the sound produced by the switching element being transmitted out of the casing through the passage opening included in the acoustic channel provided in the casing wall; and at least two support elements disposed next to the switching element, configured to mechanically connect the printed circuit board to the casing, each of the at least two support elements being spaced apart from the switching element by a distance less than two centimeters and configured to stabilize the printed circuit board against a tremor produced by the switching element when the switching element produces the sound, and each of the at least two support elements correspond to a screw and is made of a metal material.

12. The motor vehicle as claimed in claim 11, further comprising a passenger compartment, wherein the sound produced by the switching element is transmitted out of the casing through the passage opening included in the acoustic channel provided in the casing wall to the passenger compartment.

13. The motor vehicle as claimed claim 11, wherein the switching element is mechanically coupled to the operating button by a rocker.

14. The motor vehicle as claimed in claim 11, wherein the metal material of the at least two support elements includes steel or iron and has a hardness of greater than three Mohs.

15. The motor vehicle as claimed in claim 11, wherein a first support element among the at least two support elements is disposed on a first side of the switching element, and a second support element among the at least two support elements is disposed on a second side of the switching element.

16. The motor vehicle as claimed claim 11, wherein the manual actuation of the operating device operates at least one of an infotainment system, a climate control, and a suspension control of the motor vehicle.

17. The motor vehicle as claimed in claim 11, wherein the switching element is configured to produce the sound as a pulse having a duration less than 500 milliseconds.

18. The motor vehicle as claimed in claim 11, wherein the switching element is configured to produce the sound as an audible clicking sound using a clicker, in a frequency range above 700 hertz.

19. The motor vehicle as claimed in claim 11, wherein the switching element is configured as a microswitch.

20. The motor vehicle as claimed in claim 11, further comprising an instrument panel and a center console, wherein at least one operating device is disposed at at least one of the instrument panel and the center console.

* * * * *

UNITED STATES PATENT AND TRADEMARK OFFICE
CERTIFICATE OF CORRECTION

PATENT NO. : 10,163,591 B2  
APPLICATION NO. : 15/553518  
DATED : December 25, 2018  
INVENTOR(S) : Michael Wachinger Page 1 of 1

It is certified that error appears in the above-identified patent and that said Letters Patent is hereby corrected as shown below:

In the Claims

In Column 6, Line 31:  
In Claim 3, delete "claimed" and insert -- claimed in --, therefor.

In Column 6, Line 34:  
In Claim 4, delete "claimed" and insert -- claimed in --, therefor.

In Column 6, Line 40:  
In Claim 6, delete "claimed" and insert -- claimed in --, therefor.

In Column 7, Line 22:  
In Claim 13, delete "claimed" and insert -- claimed in --, therefor.

In Column 7, Line 25:  
In Claim 14, delete "claimed" and insert -- claimed in --, therefor.

In Column 8, Line 8:  
In Claim 16, delete "claimed" and insert -- claimed in --, therefor.

Signed and Sealed this  
Twenty-sixth Day of March, 2019

Andrei Iancu  
*Director of the United States Patent and Trademark Office*